US005135108A

United States Patent [19]

Nestlen et al.

[11] Patent Number: 5,135,108

[45] Date of Patent: Aug. 4, 1992

[54] RELAYS WITH WATER-TIGHT BASEPLATES

[76] Inventors: Wolfgang Nestlen, Konrad-Witz-Str. 12, Rottweil, Fed. Rep. of Germany, 7210; Gerd Schmitt, Harras 53, Wehingen, Fed. Rep. of Germany, 7209

[21] Appl. No.: 613,774

[22] Filed: May 24, 1984

[30] Foreign Application Priority Data

May 27, 1983 [DE] Fed. Rep. of Germany ....... 3319329

[51] Int. Cl.[5] ........................ B65D 85/38; H05K 5/06

[52] U.S. Cl. .................................. 206/328; 174/52.3; 335/202

[58] Field of Search ..................... 156/69, 91, 92, 252, 156/257, 268; 174/52 S, 52 PE, 52.2, 52.3; 200/293, 302.1, 302.2; 206/328; 335/302; 338/253, 272, 276, 306, 312

[56] References Cited

U.S. PATENT DOCUMENTS

| | | | |
|---|---|---|---|
| 3,513,274 | 5/1970 | Jullien-Davin | 200/302.2 |
| 3,917,921 | 11/1975 | Jakubauskas | 200/293 |
| 3,986,083 | 10/1976 | Carino | 174/52 S |
| 4,004,199 | 1/1977 | Pearce et al. | 174/52 S |
| 4,074,417 | 2/1978 | Pearce et al. | 174/52 S |
| 4,176,241 | 11/1979 | Schedele et al. | 335/202 |
| 4,246,437 | 1/1981 | Frey et al. | 174/52 PE |
| 4,309,816 | 1/1982 | Takeyama et al. | 200/302.1 |
| 4,366,345 | 12/1982 | Jalgle | 264/261 |

FOREIGN PATENT DOCUMENTS 2618492 11/1977 Fed. Rep. of Germany ... 174/52 S

*Primary Examiner*—Jimmy G. Foster

*Attorney, Agent, or Firm*—Paul H. Gallagher

[57] ABSTRACT

The relay with water tight baseplate includes grooves in the region of the baseplate, through which (the grooves) the joining pins of the relay reach, and the inner space between the grooves and the joining pins is tightly filled with a casting mass. For this better distribution of the casting mass, the rabbet canals are arranged in the baseplate and the glue is positioned in the rabbet canals. The rabbets can hereby be formed as one-sided, open profile canals, or also as an enclosed canal system, which simply strikes the region around the grooves with casting mass (FIG. 1). The relay also includes connecting structure between the baseplate and the cap which utilizes rabbet/groove structure filled with casting mass.

2 Claims, 8 Drawing Sheets

RELAYS WITH WATER-TIGHT BASEPLATES

The invention concerns a relay with water tight baseplates through which joining pins pass within the region of grooves, and wherein the region of the grooves are tightly joined with the joining pins by means of a casting mass (e.g. glue or adhesive).

A relay mentioned in the introduction has become known in various forms, in that fluid-tight and gas-tight sealing of the joining pins through the baseplate is produced by an adhesive mass being applied to the even formed underside of the baseplate, the adhesive separating under heat influence. The baseplate thereby forms a type of trough with a vertically steeply projecting flange of the cap, and the adhesive that becomes fluid under the effect of heat is delivered into the trough. A disadvantage of this known relay is that a relatively large amount of adhesive is necessary in order to achieve the desired water-tight closure of the joining pins in the baseplate, and simultaneously to guarantee a tight connection of the baseplate in the cap. A further disadvantage of the known relay is that by reason of the relatively large amount of adhesive used, the adhesive creeps up at the joining pins by capillary action, making difficult the adhesiveness and solderability of these joining pins. In addition, only such adhesives can be used as become fluid when heated, and not glues of higher viscosity and poor fluidity. In contrast to the kind of relay mentioned above, the relay of the present invention is produced by an automatic manufacturing process wherein the glue is confined, relatively small amounts being directed to the places where the relay should be, in the direction of the cap and in the direction of the joining pin.

To overcome the difficulties mentioned, the invention is characterized in that in the baseplate, there are formed rabbet canals leading to the grooves.

An essential characteristic of the present invention is therefore that the casting mass (e.g. glue, adhesive or filling resin) is introduced only within the region of the rabbet canals and since all grooves are joined to each other through rabbet canals within the region of the baseplate, only a very small amount of glue is necessary, which fills only the rabbet canals, and not the innerlying surfaces of the baseplate as in previous production methods.

The rabbet canals of course surround the grooves with a certain radius, so that within the region of the baseplate the grooves are extensively filled from the glue that enters the rabbet canals.

With the given technical solution the further essential advantage is realized, that the capillary effect is now, according to the invention, substantially lessened, that is, creeping up of the glue on the joining pins is eliminated and consequently a substantially lesser amount of glue is needed. The relays are closed off with a separate baseplate or a baseplate integrated in the cap.

The grooves for the joining pins in the baseplate, or as the case may be, in the cap; hold closing membranes which are penetrated by the joining pins following the penetration through the grooves in the baseplate. Without additional steps, that is, without introducing glue, there is nevertheless, realized a certain degree of tightness. There is a further advantage realized thereby, namely, that when more grooves are available in the baseplate than joining pins, the grooves that are not penetrated by the joining pins remain closed by means of the sealing membranes, and additionally are further sealed with the applied adhesive. An influx of adhesive into the interior of the relay is thereby avoided in every case. Since the joining pins pierce the closing membranes in the grooves, upon penetration through these grooves, the further advantage is realized that these closing membranes lie relatively tightly on the joining pins and, with the pouring of glue, in every case the glue reaches past the joining pins through the grooves into the interior of the relay.

Through the additional casting mass put into the rabbet canals, the relays become thereby completely tight. The casting mass is introduced into a reservoir of the baseplate and, under the effect of heat or pressure, flows through the rabbet canals and connecting canals, so that the joining pins and the outer edges of the baseplate adhere or fasten to the cap.

There are altogether three different design forms, which relate to the construction of the baseplates, and the dispersion of the filling resin connected therewith.

A first construction involves the feature that the filling resin is separated under heat effect, whereby the rabbet canals are formed as one-sided profile canals, which emanate starshaped from a deepened fixed reservoir generally in the middle of the baseplate, and run into a rim-sided, surrounding rabbet canal, which borders an erect flange of the cap. With this design form the filling resin remains visible from outside, and the baseplate is instrumentally easily produced and constructed as a single piece.

A further form of the invention involves the feature of pressure driven dispersion of the filling resin. The filling resin is dispersed under pressure, whereby the rabbet canals are formed as three-sided closed profile canals in the inner space between two overlying baseplates, and the baseplates are held together with a notch connection. In the outer lying baseplate is a filling opening, penetrating therethrough, this opening backing into the inner space between the overlying baseplates. In the inner space between these baseplates, are formed the described enclosed rabbet canals. The cast resin applied over the outer baseplate separates in the inner space between the baseplates and completely surrounds the joining pins that have entered the grooves, so that again a complete tightening and a binding of the two-part baseplate with the edge of the cap is guaranteed. In order to be able to determine whether the entire space has been filled with casting resin, an outlet is provided, so that after complete filling of the inner space, the surplus cast resin escapes through the outlet and one can determine from outside, whether the inner space is filled.

Instead of introducing the cast resin under pressure, it is of course possible to allow the cast resin to flow into the cast opening under the influence of heat. With this type of process, the separation of the cast resin is not visible, because the overlying baseplate functions as a blind. It is guaranteed that no capillary formation results at the edges and at the joining pins above the overlying baseplate, because the cast resin lies only in the inner space between the baseplates, and the baseplates, both toward the interior and toward the exterior of the cap, are tightly closed by the sealing membrane in the grooves. The two-part formation of the baseplate that consists of two-part plates, results in a relatively simple production, because each baseplate is produced with its own die-cast tool and both baseplates are then notched to each other, whereafter the inner space is filled with cast resin.

A third form of the invention involves a pressure driven cast resin dispersion according to the above mentioned description of the second design example, whereby according to the present form, not a two-part baseplate, but a one-part baseplate, is provided. The baseplate according to the present form, is formed as a one-piece plate, whereby the rabbet canals within the region of the surrounding edge are open to the outside, and as viewed in cross section of the one-piece baseplate, an 'island' is formed in the middle, which is not filled with the cast resin.

In the way of production techniques, the rim-sided surrounding rabbet canals are produced by means of slides (bolts) that attach the parallel plane to the plane of the baseplate so that the one-piece baseplate forms a double T profile in cross section.

Care must be taken so that the joining between the baseplate and the edge of the cap is absolutely liquid and gas-tight, yet still allow a certain mechanical play. Thus there is provided the connection of the rim-sided, surrounding rabbet canal in the baseplate with the cap over a connection canal that arises from connection with the rabbet canal which (rabbet canal) for its part feeds into a rim-sided rabbet canal in the cap.

In order to reach a positive connection between the cap and the baseplate, there is provided meshing, positive rabbet/rib connectors between the cap and the baseplate.

The object of the present invention does not arise only out of the individual patent claims but also out of the combination of the individual claims together. All of the specifications and characteristics evident in the disclosure, especially the spatial development presented in the drawings, are claimed as essential to the invention, in so far as they individually or in combination are new in relation to techniques.

In the following the invention at hand is more closely illustrated by means of several development means presented in the drawings. These are evident from the drawings and the description, further characteristics and advantages, of the invention that are essential to the invention.

Figure 1:
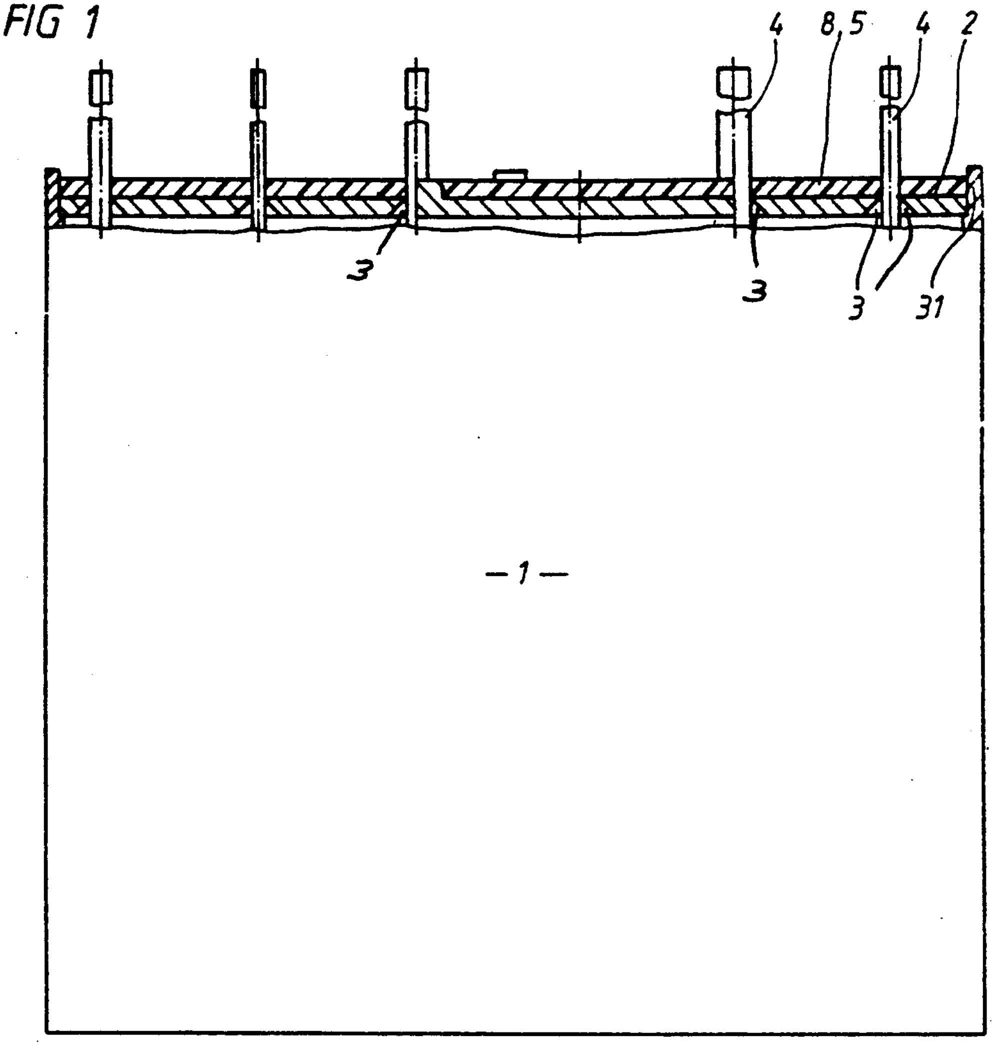
FIG. 1: Cross section of the baseplate according to a first design form, according to line I—I in FIG. 2, FIG. 2: Overview of the baseplate according to FIG. 1, FIG. 3: Profile of the baseplate in a second design form, according to line IV—IV in FIG. 4, FIG. 4: Overview of the baseplate in FIG. 3 in direction of the arrow IV.
Figure 2:
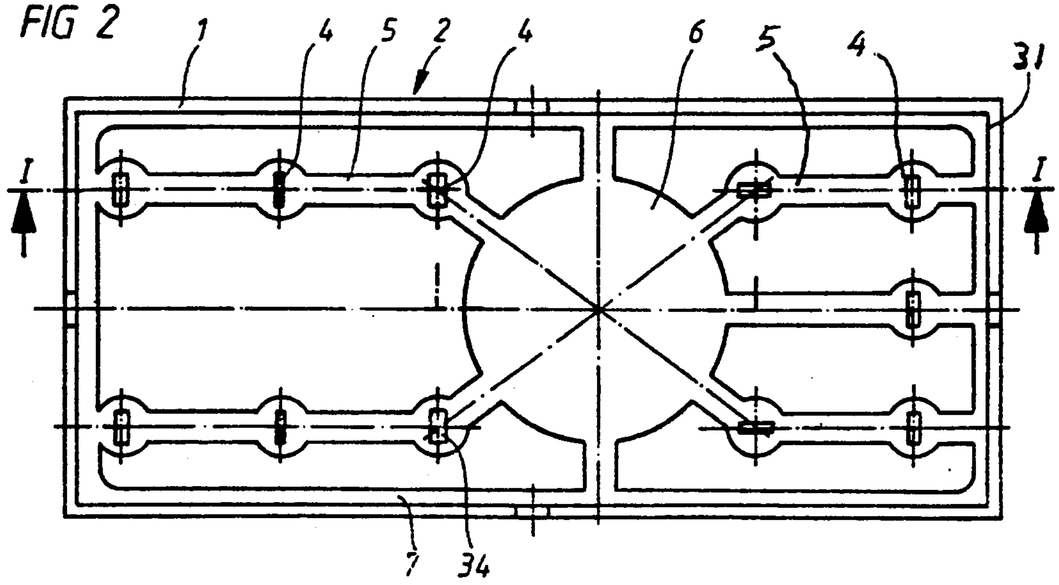

The baseplate 2 shown in FIGS. 1 and 2 is set tightly in the inner space that is surrounded by the vertically projecting flange 31 of a cap 1. The baseplate 2 is interspersed with wedge formed grooves 3 that narrow from the under side to the upper side, where each groove is closed with a sealing membrane. Pursuant to the relay with its joining pin 4 being mounted in the baseplate 2, the joining pins 4 penetrate the wedgeformed grooves 3, and following that, the sealing membrane is penetrated. The grooves 3 are therefore constructed wedge form, in order to guarantee an untwisted, central entry of the joining pin 4 into the grooves 3.

At the upper side of the baseplate 2, the grooves 3 are formed in and as a part of surrounding rabbet canals 5 that are joined together, and which emanate in star-shaped pattern from a reservoir 6 arranged generally in the middle of the baseplate, and feed into a rim-sided surrounding rabbet canal 7. Upon being fed into the reservoir 6, a fluid, or fluid that solidifies and becomes glue, flows immediately from the reservoir 6 in an outward direction over the rabbet canal 7 and fills all rabbet canals 5, 7. In this way, the joining pins 4 that are inserted into the region of the rabbet canals are extensively surrounded with the cast resin mass, and the grooves 3 are completely and tightly closed. By means of the distribution of this glue in the rim-sided surrounding rabbet canal 7, there is effected a fast connection of the baseplate 2 with the high-drawn flange 31 of the cap 1.

There follows therefore an automatic distribution of the glue by reason of the constructed rabbet canal in connection with the reservoir, which is not the case with the conventional filling techniques. With conventional water tight relays, the glue had to be applied to several different points on the baseplate, in order to effect a somewhat even distribution on the baseplate. Such a complicated process is avoided by the present invention in that only a single deposit of adhesive is applied in the middle of the reservoir 6 and the adhesive then automatically distributes itself. With the use of thinly flowing glue, heat need not be applied thereto.

In FIG. 2 is shown a groove 3 closed by a sealing membrane 34, which groove is not penetrated by a joining pin 4, whereby the groove remains closed and is additionally sealed by the glue flowing thereover.

The form shown in FIGS. 3–8 differs from the first form in that the canals are not opened in the direction of the outer side of the baseplate, but rather are completely closed in the inner space between the two baseplates 12, 14. In the cap 10 a surrounding rabbet 11 is formed, into which extends a downward projecting, rim-sided surrounding flange of the baseplate 12. The underlying baseplate shows notch bolts (pegs) 15 that are arranged vertically upward, which bolts extend into corresponding notches 16 of the baseplate 14. In this way the upper baseplate 14 and the lower baseplate 12 can at times be produced in a separate work process.

It is of course also possible, that in kinematic conversion, notch bolts are arranged downward on the upper baseplate 14, which notch bolts extend into corresponding openings of the lower baseplate.

Between the overlying baseplates 12, 14, are formed enclosed canals 17, 18 interconnected with each other. Within the region of the canals 17, 18 are formed the wedge shaped grooves, whereby in the lower baseplate 12 the wedge shaped grooves 13 narrow toward the top, while similarly in the upper baseplate 14 are upwardly narrowing grooves 33. In this upper plate 14 is a filling opening 19, which feeds into the distribution system formed by the canals 17, 18. With the introduction of glue through a nozzle into the filling opening 19, this glue fills under pressure the canals 17, 18, and thereby results in a single step the filling of the grooves 13, 33, as well as the rim-sided connection between the baseplate 12, 14 with the rim of the cap 10.

In order to ascertain when the canal system is filled, at the end of the canal system is an exit opening 20, through which the glue exits when the canal system is completely filled.

Because the glue is directed between two baseplates, and the upward and downward leading grooves 13, 33, in the baseplate are closed for the time being by means of the sealing membranes, the situation is prevented where the glue reaches into the interior of the cap, or to the outside of the outer baseplate 14.

Figure 3:
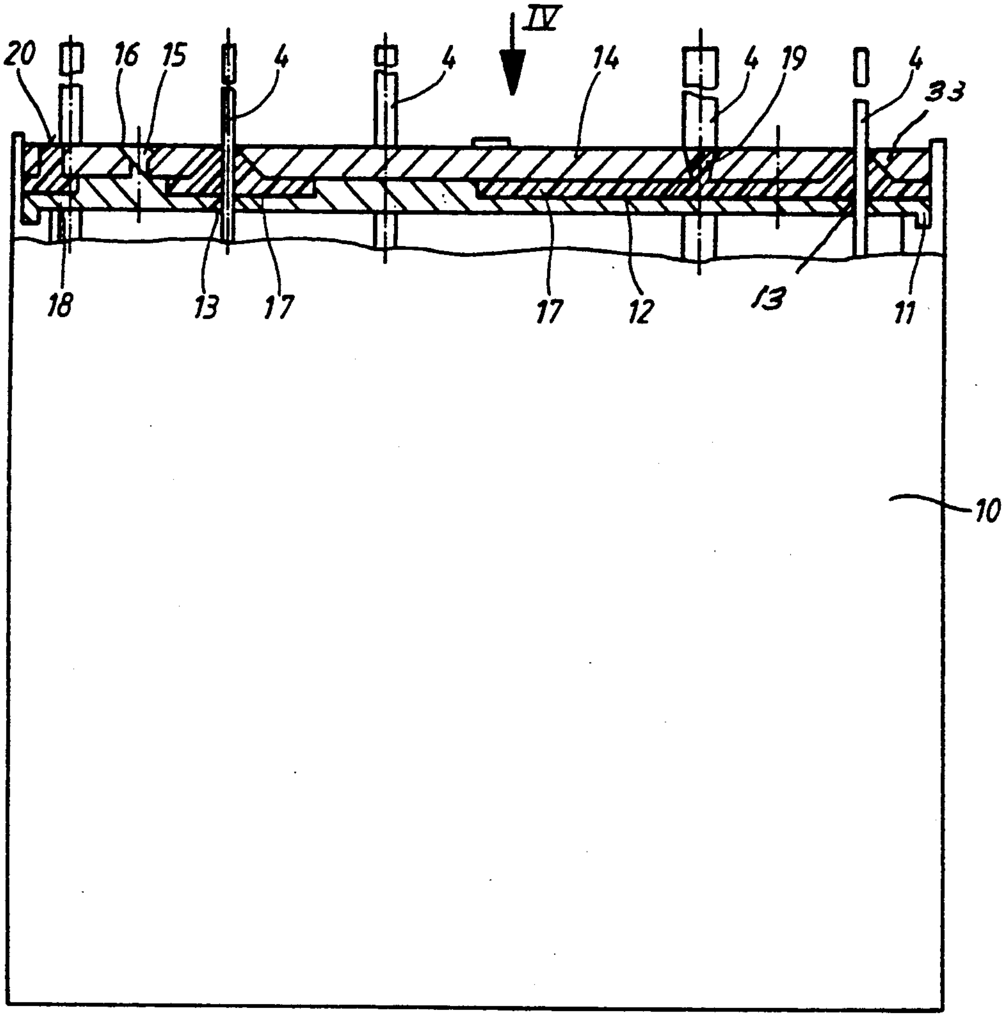
Figure 4:
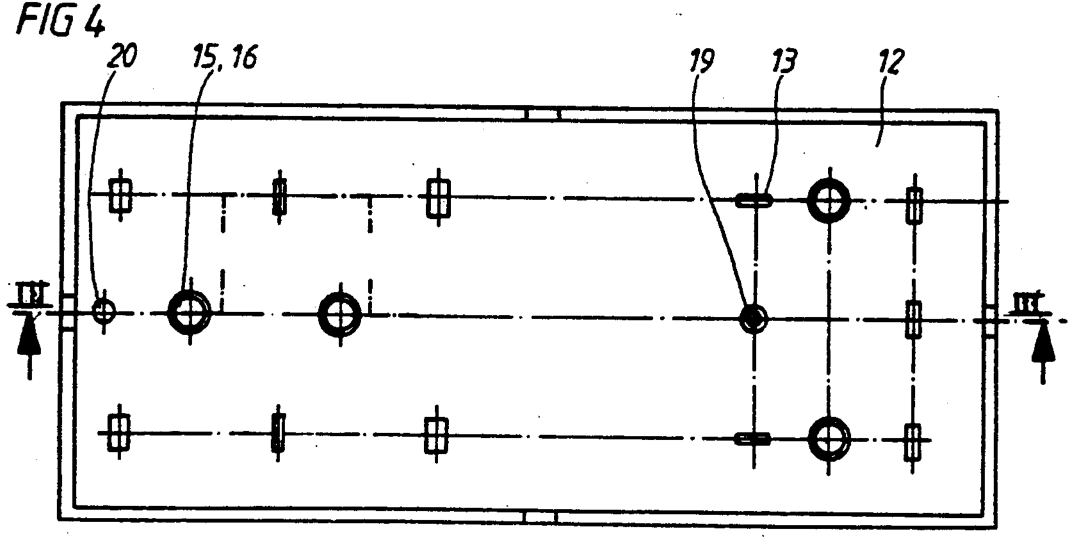
Figure 5:
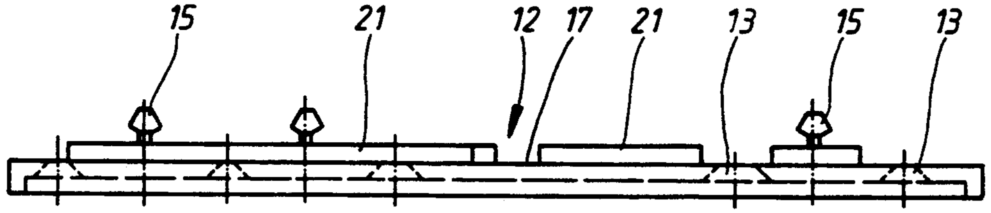
FIG. 5: Side view of the lower plate.
Figure 6:
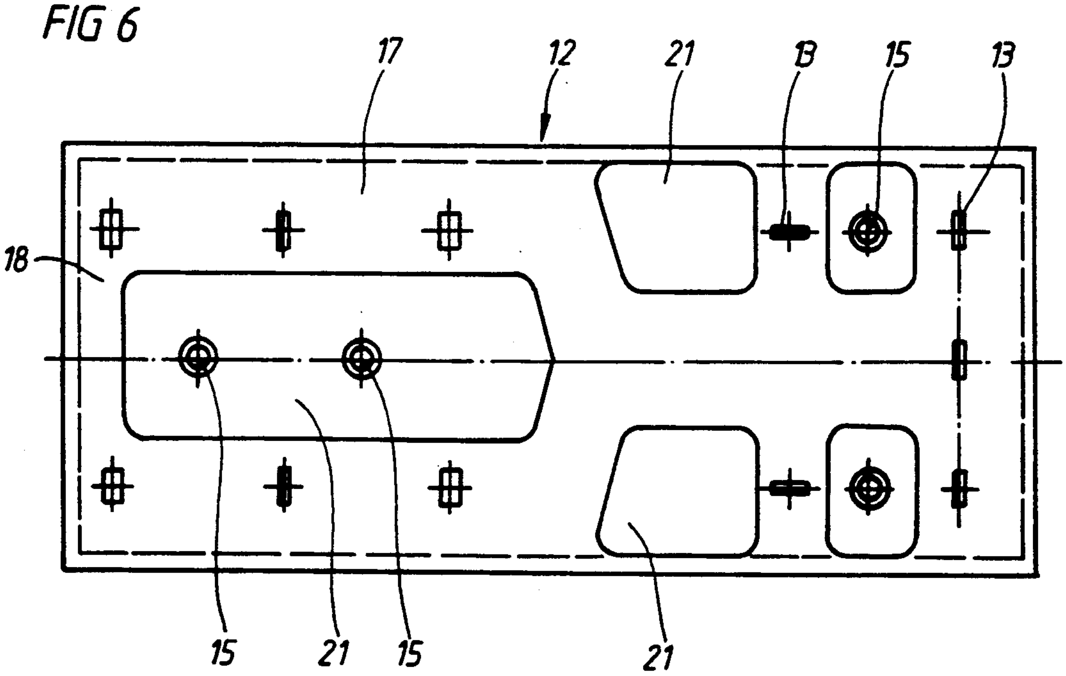
FIG. 6: Overview of the lower plate according to FIG. 5, FIG. 7: Side view of the upper baseplate.
Figure 7:
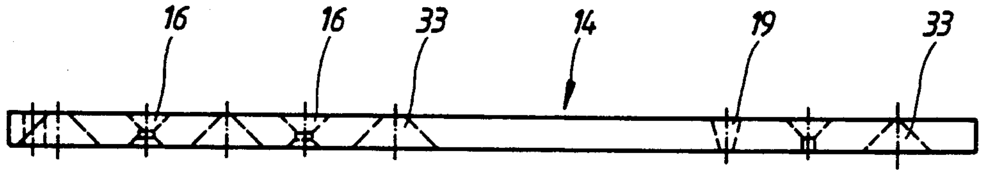
Figure 8:
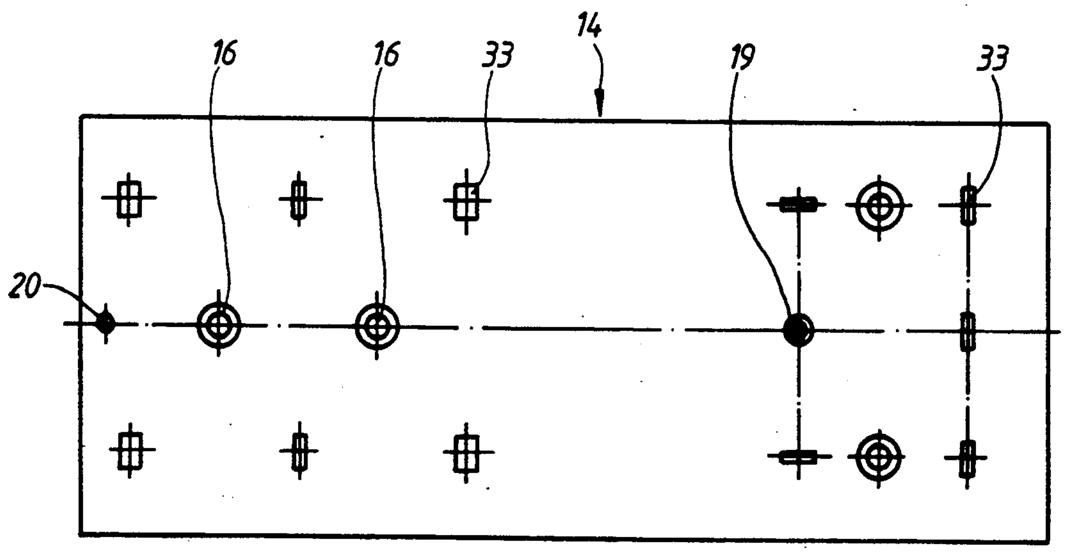
FIG. 8: Overview of the upper baseplate.
Figure 9:
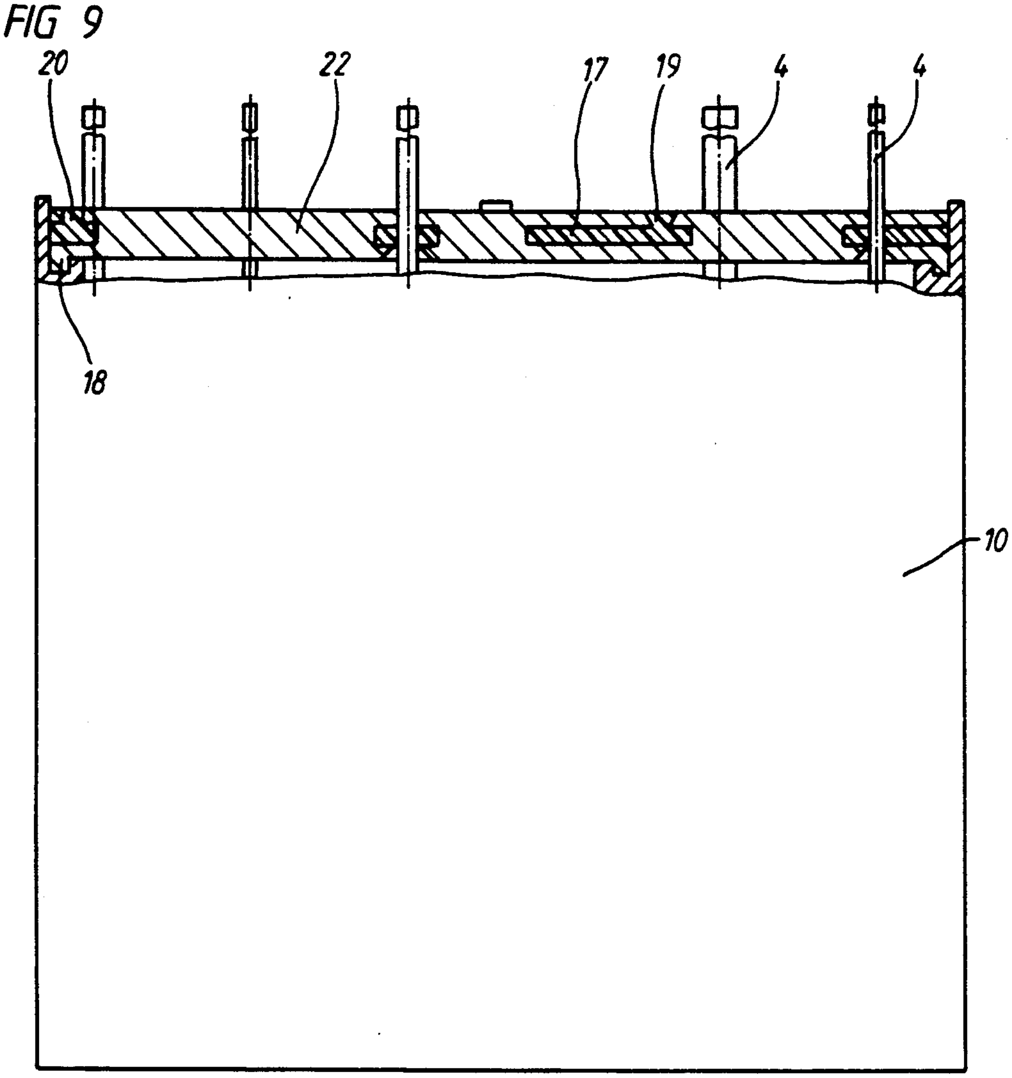
FIG. 9: Profile according to line IX—IX in FIG. 10, of a thrid design example of a baseplate.
Figure 10:
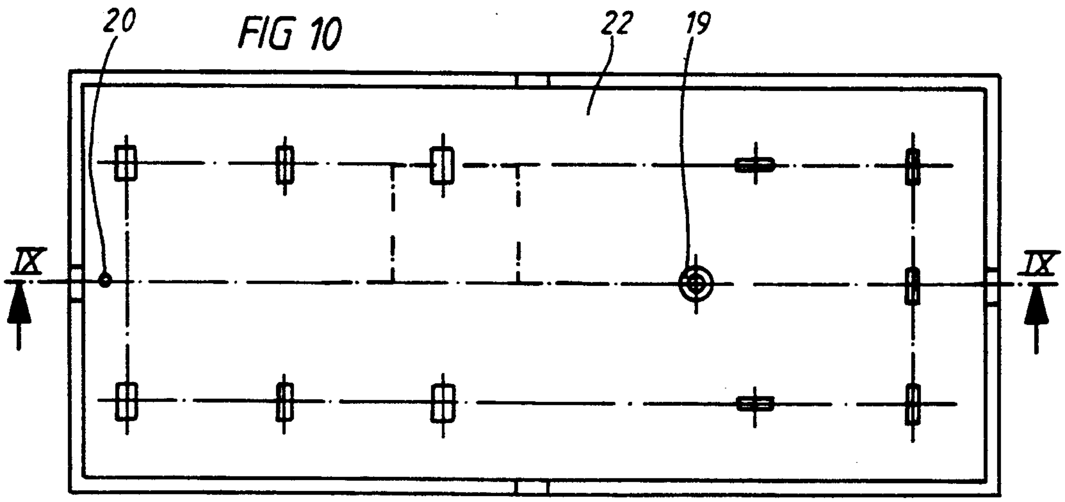
FIG. 10: Overview of the baseplate according to FIG. 9, FIG. 11: Profile according to line XI—XI in FIG. 12, FIG. 12: Side view of the baseplate according to FIG. 9, FIG. 13: Profile according to the line XIII-XIII in FIG. 12, FIGS. 14 to 22: Partial profile through the connection region between the baseplate and cap in several design variations.

Because the baseplate is fully enclosed, it is also possible to hold the relay in an upside down position, as shown in FIG. 3, and fill it from the bottom. In this filling position, it is assured that the glue cannot in any way penetrate into the interior.

The circular and enclosed canal system that consists of canals 17 and 18 is formed on the lower baseplate 12 by means of island 21 in raised cross section. The upper baseplate 14 is, according to FIGS. 7 and 8, technically easier to produce because only the different grooves and openings 16, 19, 20, 33 must be provided for.

Figure 11:
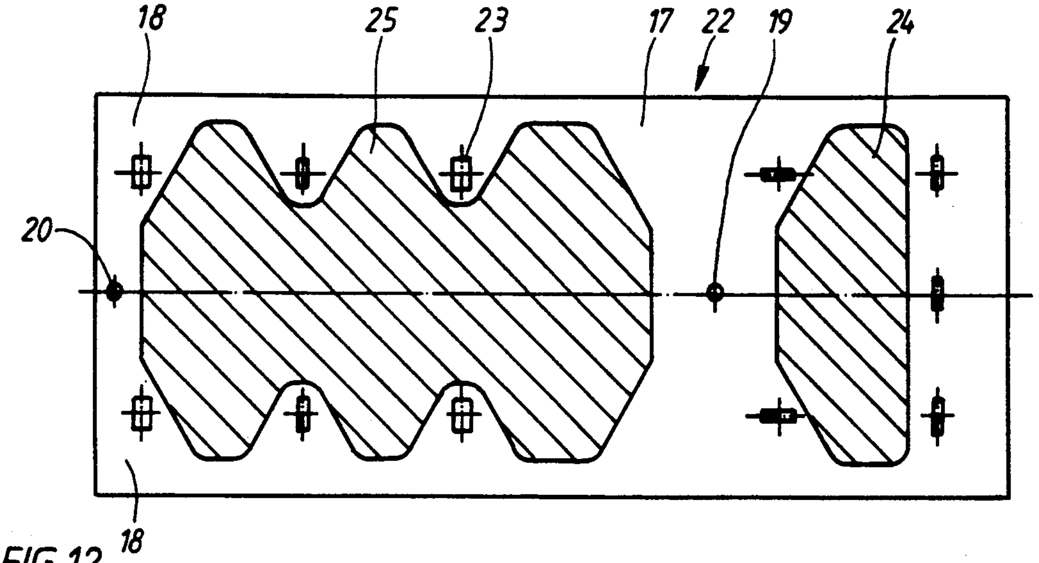
Figure 12:
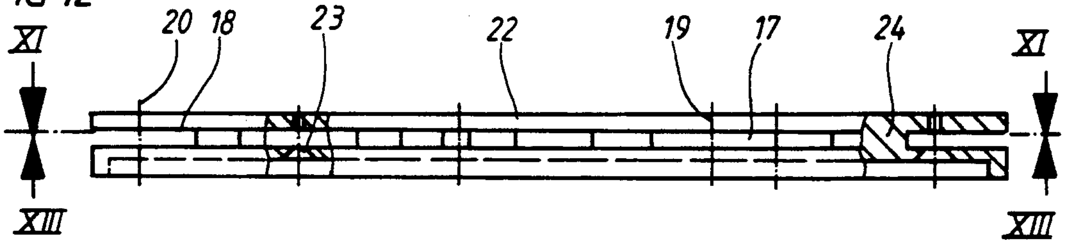
Figure 13:
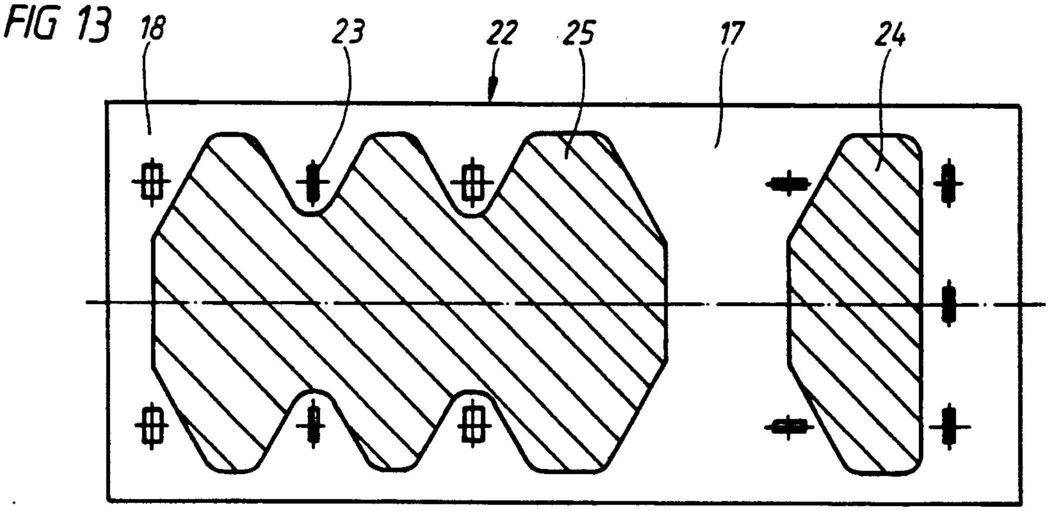

FIGS. 9–13 show that instead of a two-part baseplate a one-part baseplate 22 is also possible, with an enclosed canal system consisting of canals 17, 18. The canals 17, 18 are open to the rim sides, as seen in FIGS. 11 and 13. The mid part of the baseplate 22 is in this case also includes interconnecting the inner and outer elements of the baseplate, elevations 24, 25 so that the rim-sided surrounding canals 17, 18 are formed outwardly beyond the elevations 24, 25. Within the region of the canals 17, 18, the grooves as well as the filling opening 19 and the exit opening 20 are arranged.

Figure 14:
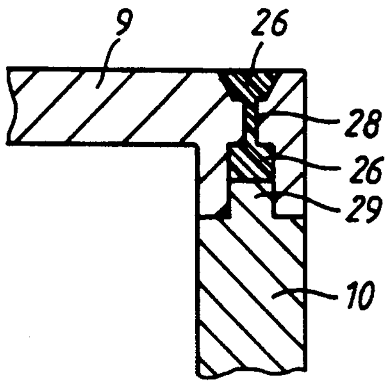
Figure 15:
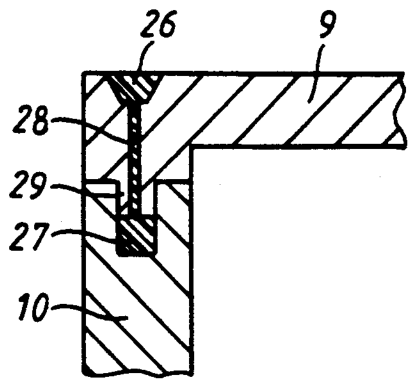
Figure 16:
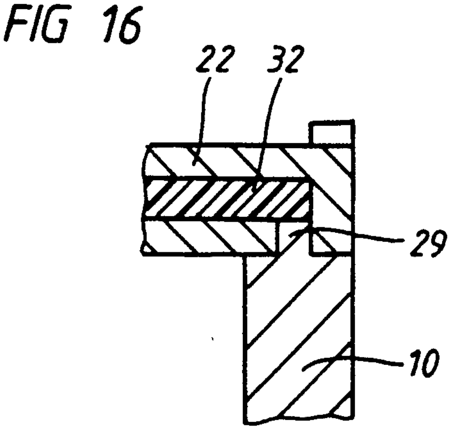
Figure 17:
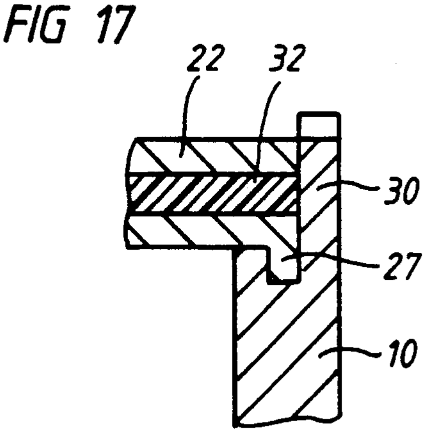
Figure 18:
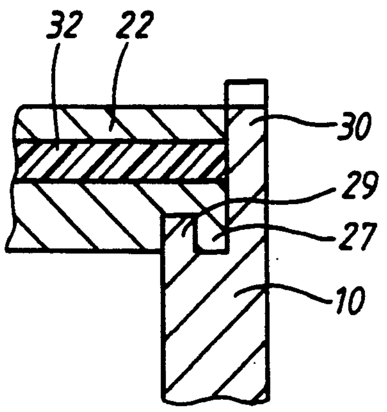
Figure 19:
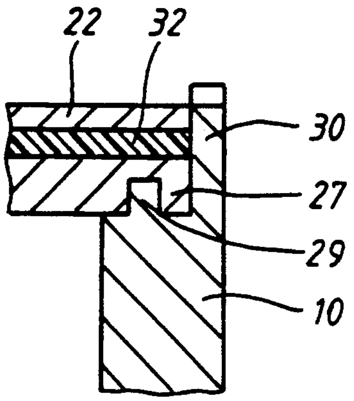

FIGS. 14–22 show different variations of positive connections between the baseplate 9 and the cap 10. In the form of FIGS. 14 and 15, is a rim-sided, surrounding, rabbet groove communicating with 26, a connecting canal 28, which in turn communicates with a second rim-sided, rabbet groove 26 within the region of an elevated, vertical rib peripheral flange 29 of the cap 10. FIG. 15 shows that the rib 29 can also be arranged at the baseplate 9.

Common to FIGS. 16–22 is that next to the positive connection with help of the glue inserted into a rabbet 32 between the cap 10 and the baseplate 22, a further secure connection results—meshing of ribs 29 into corresponding rabbets 27 between the cap and baseplate. According to FIG. 19 there is also seen an adjacent lying rib 29 and rabbet 27 as a positive connection between the cap 10 and the baseplate 22.

Figure 20:
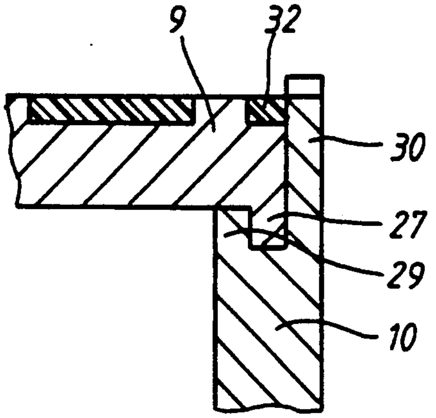
Figure 21:
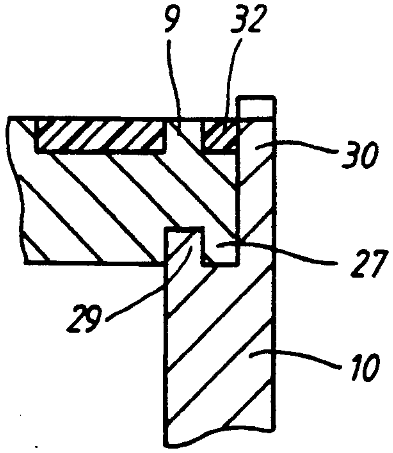
Figure 22:
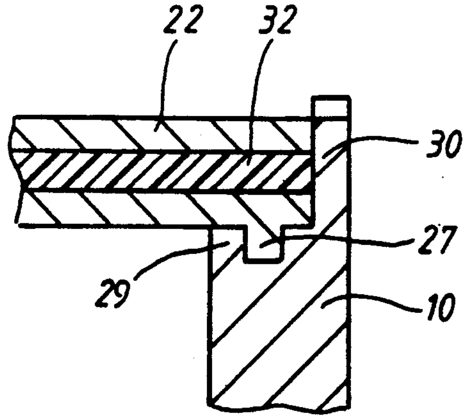

FIGS. 20 and 21 show that the rabbet 32 can be separated from the upper rabbet track, and in a manner not shown, feed at another position into the head rabbet.

The rim 30 of the cap is always drawn up over the plane of the baseplate.

We claim:

1. Relay including a cap having an open side and a baseplate closing the open side, and having apertures extending through the baseplate, and joining pins mounted in the apertures and projecting on opposite sides of the baseplate,
   - the cap having a peripheral flange surrounding the open side thereof, and the baseplate being positioned thereon, and said baseplate having its peripheral edges effectively engaging inner and outer sides of, the peripheral flange,
   - the baseplate having first interiorly facing grooves formed therein surrounding and forming extensions of the apertures, and second interiorly facing grooves opening through the periphery of the baseplate, whereby the peripheral flange on the cap is adapted to close the grooves around the periphery of the baseplate.

2. Relay according to claim 1 wherein,
   - the closure of the grooves around the periphery of the baseplate comprises interengaging groove and rib elements forming positive interlock therebetween.

* * * * *